United States Patent [19]

Chou et al.

[11] Patent Number: 5,019,210

[45] Date of Patent: May 28, 1991

[54] METHOD FOR ENHANCING THE ADHESION OF POLYMER SURFACES BY WATER VAPOR PLASMA TREATMENT

[75] Inventors: Ned J. Chou, Yorktown Heights; Ronald D. Goldblatt, Rye Brook; John E. Heidenreich, III; Steven E. Molis, both of Yorktown Heights; Luis M. Ferreiro, deceased, late of Bardonia, all of N.Y., by Annette Mitchell, legal representative

[73] Assignee: International Business Machines Corporation, Armonk, N.Y.

[21] Appl. No.: 332,656

[22] Filed: Apr. 3, 1989

[51] Int. Cl.$^5$ .................. B44C 1/22; B29C 37/00; C03C 15/00; B32B 31/00

[52] U.S. Cl. .................. 156/643; 156/272.6; 156/307.1; 156/308.2; 156/633; 156/646; 204/192.36; 252/79.1; 427/307; 427/299; 427/322; 428/473.5

[58] Field of Search ............. 156/272.6, 307.1, 308.2, 156/629, 633, 643, 646; 427/38, 39, 40, 41, 307, 322, 299; 428/473.5, 474.4; 204/192.32, 192.36; 252/79.1

[56] References Cited

U.S. PATENT DOCUMENTS

| | | | |
|---|---|---|---|
| 4,155,826 | 5/1979 | Nakai et al. | 204/192.36 |
| 4,382,101 | 5/1983 | Polak | 427/40 |
| 4,504,349 | 3/1985 | Ueno et al. | 156/272.6 |
| 4,637,851 | 1/1987 | Ueno et al. | 156/272.6 |
| 4,715,941 | 12/1987 | Jones et al. | 204/192.36 |
| 4,731,156 | 3/1988 | Montmarquet | 156/272.6 X |
| 4,740,282 | 4/1988 | Gesser et al. | 204/165 |
| 4,755,424 | 7/1988 | Takeoka et al. | 428/323 |
| 4,756,964 | 7/1988 | Kincaid et al. | 156/272.6 X |
| 4,765,860 | 8/1988 | Ueno et al. | 156/272.6 |
| 4,772,348 | 9/1988 | Hirotakawa et al. | 156/272.6 |
| 4,820,580 | 4/1989 | Hocker et al. | 156/272.6 X |

OTHER PUBLICATIONS

Nakamea et al, "Effect of H$_2$O Plasma Treatment on the Adhesion of Metal Thin Films", Journal of the Chemical Society of Japan, No. 11, 1987, p. 1995.

Evans, et al, "Angle Resolved ESCA Analysis of Plasma Modified Polysterene", Fresenius Z. Anal. Chem. (1984) 319; pp. 841–844.

"Surface Modification of Poly (Ethylene Terephthalate) by Electrical Discharge Treatment", Journal Polymer, Aug. 1980, vol. 21, p. 805.

Nuzzo, et al, "Preparation and Characterization of Functionalized Polyethylene Surfaces", Journal of Macromolecules 1984, 17, pp. 1013–1019.

Darchicourt et al, "Polymer Surface Treatment by an Argon–Oxygen Microwave Discharge", Journal Vide Couches Mines (France) No. 237, Suppl.-1987, pp. 53–55.

Hook et al, "Multitechnique Surface Spectroscopic Studies of Plasma Modified Polymers", Journal of Materials Research, May, 1986.

Hans Dressler, Samuel N. Holter, "Polyimides", Encyl. of Chem. Tech., Third Edition, vol. 18, John Wiley & Sons, pp. 704–719.

"Plasma Technology" Encycl. of Chem. Tech., Third Edition Supplement, John Wiley & Sons, pp. 599–625.

K. M. Abrahmovich, R. T. Gleason and W. T. Motsiff, "Method for Improving Adhesion of Polyimides", IBM Technical Disclosure Bulletin, vol. 22, No. 1 Jun. 1979, p. 42.

Primary Examiner—William A. Powell
Attorney, Agent, or Firm—Daniel P. Morris

[57] ABSTRACT

Method for water vapor plasma treating the surface of a polymer body to enhance the adhesion of a first and second polymer surface. The method is particularly useful for polyimide surfaces.

16 Claims, No Drawings

METHOD FOR ENHANCING THE ADHESION OF POLYMER SURFACES BY WATER VAPOR PLASMA TREATMENT

FIELD OF THE INVENTION

This invention relates to the treatment of a polymer surface with a water vapor plasma, more particularly, to promote the adhesion of a first polymer surface to a second polymer surface by treating the polymer surface with a water vapor plasma and most particularly to treating a polyimide surface with a water vapor plasma.

BACKGROUND OF THE INVENTION

Polymers are having increased use in microelectronic applications. Polymers are used in multi-level structures as a dielectric layer between layers containing patterned electrical conductors. These multi-level structures can be used as a substrate on which an electronic device, for example, a semi-conductor chip, can be electrically mounted. These multi-level structures can also be used as the top electrical conductor wiring levels of a ceramic substrate on which an electronic device is electrically mounted. These multi-level structures can also be used as the top electrically conductive layers of an electronic device, for example, a semiconductor chip.

The multi-layer polymer electrical conductor structure is fabricated by forming a first polymer layer on which an electrical conductor pattern is formed. A second polymer layer is disposed over the electrical conductor pattern. The second polymer layer has electrically conductive through-holes for electrical connection to the conductor pattern on the first polymer layer. A second electrically conductive pattern is disposed on the second polymer layer. Electrically conductive through-holes electrically interconnect electrically conductive pattern on the first polymer layer with the electrically conductive pattern on the second polymer layer. A structure having any number of electrically conductive layers and polymer layers can be fabricated by repeating these steps.

One of the problems in fabricating a multi-level polymer structure is to get adjacent polymer layers to adhere to each other. An adhesive layer can be disposed between adjacent polymer layers. However, adhesives have been found generally incapable of withstanding subsequent heat treatments fabricating a multi-level polymer metal structure for microelectronic applications. The adhesives as a result of these heat treatments degrade resulting in the delamination of adjacent polymer layers.

IBM Technical Disclosure Bulletin, Vol. 22, No. 1, June, 1979, p. 42, entitled "Method for Improving Adhesion of Polyimides" describes treating a cured layer of polyimide to a tetra-alkyl ammonium hydroxide salt and a dilute aqueous solution of acetic acid. A layer of uncured polyimide is deposited on the treated surface and then cured to a polyimide layer. A chemical bond is believed to be formed between the two polyimide layers, thereby increasing the adhesion between the layers. Use of a hydroxide salt has the disadvantage of introducing ions between the polyimide layers. These ions are contaminants which can result in low level current flowing between otherwise electrically isolated electrical conductors which are disposed between the polyimide layers.

An invention herein is treating a polymer surface with a water vapor plasma to enhance the adhesion of the treated layer to a second polymer layer.

U.S. Pat. No. 4,382,101 describes enhancing the adhesion of a metal layer to a polymer layer, e.g. a polyimide layer, by treating the surface to a plasma of a gas such as helium, argon and combinations of gases such as carbon tetrafluoride in oxygen.

U.S. Pat. No. 4,765,860 describes enhancing the adhesion of a metal layer to a polymer layer e.g. a polyimide layer, by exposing the polymer layer to a low temperature plasma of one or more of helium, neon, argon, nitrogen, oxygen, air, nitrous oxide, nitrogen monoxide, nitrogen dioxide, carbon monoxide, carbon dioxide, bromine cyanide, sulfur dioxide, hydrogen sulfide and the like.

U.S. Pat. No. 4,755,424 describes enhancing the adhesion of a metal layer to a polymer layer having minute projections thereon by subjecting the polymer surface to a corona discharge.

U.S. Pat. No. 4,740,282 describes a treatment for a synthetic plastic intraocular lense to avoid protein adhesion to the lens. The lens is treated by first cross-linking the lens surface by treating the surface with a stream of low pressure hydrogen gas in the presence of an A.C. electrical discharge, and thereafter treating the cross-linked surface with hydroxyl radicals to hydrophilize the surface.

The article in the Journal of the Chemical Society of Japan, No. 11, 1987, p. 1995, entitled "Effect of $H_2O$ Plasma Treatment on the Adhesion of Metal Thin Films" of Nakamae et al., describes the treatment of poly(ethylene terephthalate) films with a $H_2O$ plasma which improves film wettability and the adherence of a Co film deposited onto the polymer film.

The article in Fresenius Z. Anal. Chem. (1984) 319; p. 841–844, entitled "Angle Resolved ESCA Analysis of Plasma Modified Polysterene", to Evans et al. describes Angle Resolved ESCA studies of polysterene surfaces treated with $H_2O$ plasma. The studies showed higher concentrations of carbonate and ester linkages as compared to $O_2$ plasma treatment.

The article in the Journal Polymer, August 1980, Vol. 21, p. 805, entitled "Surface Modification of Poly (ethylene terephthalate) by Electrical Discharge Treatment" describes treating a film of poly (ethylene terephthalate) to an electrical discharge. Treatment enhanced the autoadhesion between two sheets of the film.

The article in the Journal of Macromolecules 1984, 17, pp. 1013–1019, entitled "Preparation and Characterization of Functionalized Polyethylene Surfaces" to Nuzzo et al. describes treating a polyethylene film to an oxygen, water or hydrogen gas plasma and the analysis of the treated surface with a high resolution x-ray photoelectron spectroscopic analysis.

The article in the Journal Vide Couches Mines (France) No. 237, Suppl.—1987, p. 53–55 entitled "Polymer Surface Treatment by an Argon-Oxygen Microwave Discharge" to Darchicourt et al. describes treating a polymer surface to an argon-oxygen microwave discharge.

The article in the Journal of Materials Research submitted May, 1986 entitled "Multitechnique Surface Spectroscopic Studies of Plasma Modified Polymers" to Hook et al. describes treating a polymethylmethacrylate film with a RF-plasma glow discharge created from a $Ar/H_2O$ gas mixture which incorporates high concentration of hydroxyl groups on the polymer film surface.

The cited art does not teach or suggest alone or in combination treating a polymer surface with a water vapor plasma to enhance the adhesion of the first and second polymer layer.

It is an object of this invention to promote the adhesion of a first polymer surface to a second polymer surface by treating at least one polymer surface with a water vapor plasma.

It is another object of this invention to promote the adhesion of a polyimide polymer surface to a second polyimide polymer surface by treatment of the polyimide surface with a water vapor plasma.

SUMMARY OF THE INVENTION

In its broadest aspect this invention is a method to promote the adhesion of a first polymer surface to a second polymer surface by treating at least one of the polymer surfaces with a water vapor plasma.

In a more particular aspect of the present invention the polymer material is a polyaromatic polymer.

In another more particular aspect of the present invention the polymer is a thermoset polymeric material.

In another more particular aspect of the present invention the polymer is a polyimide material.

DETAILED DESCRIPTION OF THE PREFERRED EMBODIMENTS

The present invention is concerned with the process for obtaining improved peel strength of a first polymer layer to a second polymer layer. The improved peel strength is affected by treating the surface of at least one of the polymeric layers with a water vapor plasma prior to disposing the second polymer layer on the first polymer layer. A gas plasma is formed by the interaction of a gas with an electric field. For example, an electric field may be provided for by a radio frequency generator which will provide the necessary field for interaction with a gas to produce radical species primarily by electron induced dissociation. These species will then interact with the outermost atomic layers of the polymeric material, whereby a stronger bond with a subsequently deposited layer can be achieved.

The method of the present invention can be used in the following three ways: 1) at least a part of the surface of a first fully cured polymer body can be treated with a water vapor plasma and the surface of a second fully cured polymer body can be disposed against the treated parts of the surface of the first polymer body; 2) at least a part of the surfaces of both the first and the second fully cured polymer bodies can be treated with a water vapor plasma and thereafter the treated parts of each surface are disposed against each other; and 3) at least a part of the surface of a fully cured polymer body is treated with a water vapor plasma thereafter a nonfully cured polymer which is typically a liquid is disposed onto the treated parts of the fully cured polymer body and thereafter cured to the fully cured state.

For applications 1 and 2, the fully cured surfaces are typically hot pressed together at greater than about 50 psi at a temperature high enough to promote chemical bonding between the surfaces such as imidizing any residual polyamic acid where the polymer surfaces are polyimide materials and dehydrating any residual hydroxyl groups on the polymer surfaces to form ether linkages therebetween. Temperatures greater than 200° C. should be adequate, preferably greater than about 375° C. but less than the temperature which will degrade the polymer.

Generation of a water vapor plasma is commonly known in the the art. A plasma is typically generated by providing a gas between an anode and a cathode between which an RF field is provided. An RF field causes the dissociation of the gas into charged particles. In a water vapor plasma water molecules may be dissociated into hydroxyl ions and protons. A substrate to be treated with the plasma is placed on either the anode or the cathode. Plasmas and the methods of generating plasmas are generally described in the Encyclopedia of Chemical Technology, Third Edition in the article entitled "Plasma Technology", Volume Supplement. The teaching of this article is incorporated herein by reference.

The reaction in which the peel strength of a first polymer body to a second polymer body is increased by treating at least a part of the surface of one of the polymer bodies with the water vapor plasma treatment can be done at a temperature which may range from about ambient (20° C. to about 25° C.) up to the glass transition temperature or melting temperature of the polymer body being treated. The preferred polymeric material to practice the present invention is a polyimide material which has a glass transition temperature above about 250° C. Other operating parameters which are employed in the process of this invention will include pressure which may range from superatmospheric, that is, up to about 5 atmospheres, down to subatmospheric pressures of about $10^{-8}$ Torr, preferably from about 50 militorr to about 300 militorr. Electric power may be from various sources such as direct current (D.C.), alternating current (A.C.), audio frequency (A.F.), intermediate frequency (I.F.), radio frequency (R.F.), microwave frequency, etc. Power density which is employed will be the electrical power per unit area and will range from about $10^{-3}$ watts/cm$^3$ to about 1000 watts/cm$^3$. The power density is preferably from about $10^{-2}$ W/cm$^3$ to about $10^{-1}$ W/cm$^3$. The power which is employed may be obtained from any source of electrical energy, a specific example being a generator. The treatment of the polymer body with a water vapor plasma is affected for a period of time which may range from about 0.1 minutes up to about 1 hour or more in duration. The time of treatment depends upon the other operating conditions including temperature, pressure and power, and will be for a period of time sufficient to treat the surface of the polymer body until said surface is more susceptible to the subsequent bonding to the surface of the second polymer body. It is contemplated within the scope of this invention that the deposition of the second polyimide body will occur within a relatively short period of time after the surface of the polymer body is treated with the water vapor plasma. If desired, the plasma treated polymer may be aged by exposure to the atmosphere for a period of time which may range up to about eight days or more in duration.

The disposition of the second polymer body onto the treated surface of the first polymer body can be achieved by any method commonly known in the art. For example, if the second polymer body is a fully cured polymer can be laminated under heat and pressure to the treated surface of the first polymer body. If the second polymer body is deposited as an uncured liquid polymer, the liquid polymer can be deposited onto the treated surface of the first polymer body by methods commonly used in the art, e.g. spin coating, dipping the treated polymer into the liquid polymer and the like. When the second polymer body is a fully cured polymer it can have any thickness. When the second polymer is first deposited as a liquid polymer, typically it has a thickness of about several thousand angstroms to several microns. The thickness of the second polymer layer when deposited as a liquid, can be increased by successive depositions of the liquid polymer.

The process of this invention may be carried out in either an open or a closed system. For example, when a closed system is employed, the polymer material which is to be treated is placed in a closed chamber and water vapor is passed into the chamber. The chamber will be maintained at a predetermined operating condition of temperature and pressure, the operating parameters of which having been hereinbefore set forth. Therefore, the chamber is subjected to a high electric field between two electrodes. A discharge is obtained, which is the water vapor plasma, and which consists of ions, free radicals and metastable gas species. The plasma products are allowed to treat the surface of the polymer for a predetermined period of time whereby the surface of said polymer is modified. At the end of the reaction time the electric power is discontinued and the treated polymer body is removed. Following this, the plasma treated polymer body is either laminated to another untreated fully cured polymer body, or laminated to another treated fully cured polymer body, or uncured liquid polymer is spun onto the treated surface and thereafter fully cured. It has been found that the resulting multi-level polymer structure for treated polyimide bodies have a peel strength at least one order of magnitude greater than the peel strength of untreated surfaces.

It is also contemplated within the scope of this invention that the water vapor plasma treatment of the polymer may be affected in an open system in which the polymer to be treated is placed in an electric field between two electrodes and subjected to the electric field while water vapor is passed over the surface of the polymer body, said polymer being maintained at a predetermined operating temperature. Following the treatment of the polymer in an open system for a predetermined period of time, the modified polymer is then laminated to another untreated fully cured polymer body or laminated to another treated polymer body or an uncured liquid polymer is deposited onto the treated surface and thereafter cured to solid state.

The preferred polymers to be treated according to the present invention are polyaromatic polymers.

The more preferred polymers are polyaromatic polymers having a high glass transition temperature. The most preferred polymers are selected from the following group:

polyamides
polyesters
polyurethanes
polysiloxanes
phenolics
polysulfides
polyacetals
polyethylenes
polyisobutylenes
polyacrylonitriles
polyvinylchlorides
polystyrenes
polymethylmethacrylates
polyvinylacetates
polytetrafluoroethylenes
polyisoprenes
polycarbonates
polyether
polyimides
polybenzimidazoles
polybenzoxazoles
polybenzothiazoles
polyoxadiazoles
polytriazoles
polyquinoxalines
polyimmidazopyrrolones and copolymers containing an aromatic constituent and a constituent selected from a vinyl and cyclobutane group, wherein the aromatic constituent and the vinyl and cyclobutane groups contain at least one of the group if Si, Ge, Ti, Zn and Fe as described in copending U.S. patent application Ser. No. 07/366,089 filed on June 13, 1989 entitled "Dielectric Structures Having Embedded Therein Ga Filling RIE Etch Stop Polymer Materials of High Thermal Stability" to Babich et. al., the teaching of which is incorporated herein by reference.

The most highly preferred polymers are polyimide type polymers. Polyimide polymers are described in the Encyclopedia of Chemical Technology, Third Edition in the article entitled "Polyimides" Volume 18, p. 704, the teaching of which is incorporated herein by reference.

Generally, the polyimides include the following recurring unit where the arrows indicate isomerism:

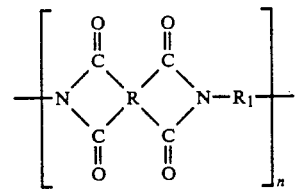

where n is an integer representing the number of repeating units to provide a molecular weight usually about 10,000 to about 100,000. R is at least one tetravalent organic radical selected from the group consisting of:

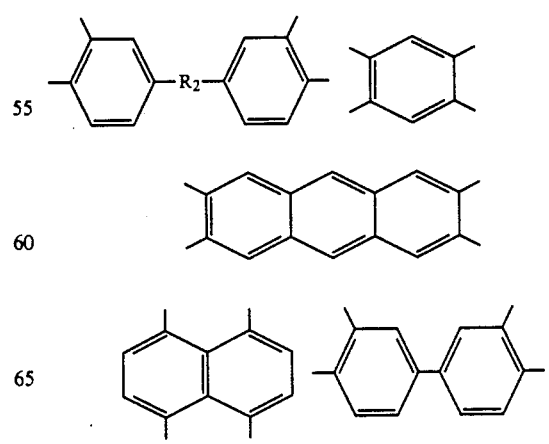

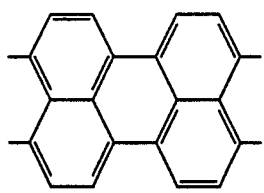

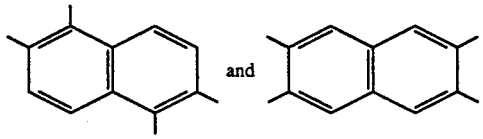

R₂ being selected from the group consisting of divalent aliphatic hydrocarbon radicals having from 1 to 4 carbon atoms and carbonyl, oxy, sulfo, sulfide, ether, siloxane, phosphine oxide, hexafluorioisopropylidene and sulfonyl radicals and in which R₁ is at least one divalent radical selected from the group consisting of an aliphatic organic radical or from the group shown:

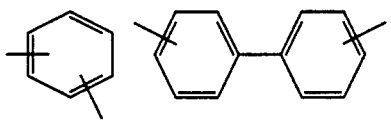

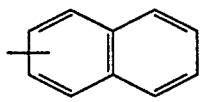

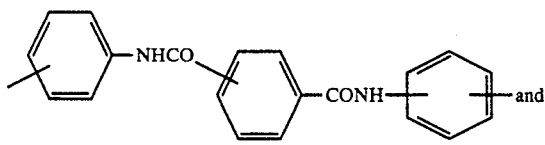

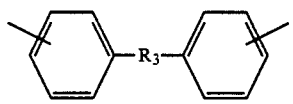

in which R₃ is a divalent organic radical selected from the group consisting of R₂, silico, and amino radicals. Polymers containing two or more of the R and/or R₁ radicals, especially multiple series of R₁ containing amido radicals, can be used.

Polyimides are available commercially from a variety of suppliers in one of three forms: a) as solutions of the polyamic acid precursors (e.g., DuPont Pyralin); as pre-imidized polyimide form (e.g., DuPont Kapton film); or c) as pre-imidized powders (e.g., Ciba-Geigy Matrimid 5218) or solutions (e.g., Ciba-Geigy Probimide). The chemistry of commerical polyimides includes examples of many of the components listed above, but a preferred polymer for use pursuant to the present invention is based on the monomers pyromellitic dianhydride (PMDA) and oxydianiline (ODA, also named 4,4'-diaminodiphenyl ether). Other preferred polymers for use pursuant to the present invention are the polymers of benzophenonetetracarboxylic dianhydrde (BTDA) and ODA and/or 1,3-phenylenediamine and polymer of 3,3'-biphenylenediamine (PDA). Polyimide films based on PMDA-ODA are available from Allied Corporation under the tradename Apical and from DuPont under the tradename Kapton. Films based on BPDA-PDA are available from UBE Corporation as Upilex and from Hitachi Chemical Company as PIQ-L100. Other tradename polyimides useful pursuant to the present invention include Durimid from Rogers Corporation and the DuPont Pyralin series, including PI-2525 and PI 2566.

The following examples illustrate the process of the present invention and the improved adhesion of a first and second polyimide body as a result of the treatment with a water vapor plasma. The present invention is not limited to these examples.

An MKS Type 1150A - SP003 - 88 Massflow meter for liquid vapor introduction was added to a plasma chamber. This manifold consists of a liquid reservoir and a variable leak valve. A positive shut off valve isolates the reservoir while another positive shut off valve isolates the entire manifold from the vacuum chamber. The manifold is wrapped with commercially available heater tape, and the temperature is controlled with a variac.

Typical plasma operating parameters are: base pressure=0.1 to 1 microtorr, and the electrode temperature is about 25° C., the plasma pressure is from about 100 to 300 millitorr and RF power is about 50 watts.

In an attempt to elucidate the surface changes upon water vapor plasma treatment, polystyrene (average molecular weight=4,400,000, PDI=1.06) was water vapor plasma treated and examined. Water contact angle measurements using the sessile drop technique (0.05 ml advancing, 0.025 ml receding) revealed a significant change upon plasma treatment. The virgin polystyrene contact angles were measured to be 90° advancing and 80° receding. Water vapor plasma treated polystyrene contact angles were measured to be 3° advancing and less than one degree receding. Transmission FTIR spectroscopy of polystyrene films that were etched in water vapor plasma from an initial thickness of 400 Å down to a final thickness of 90 Å demonstrated new bands at 1000 cm$^{-1}$ and 1750 cm$^{-1}$ not present before plasma exposure. This is consistent with the idea of surface hydroxylation/carboxylation.

Having gained this understanding of the effect of water vapor plasma treatment, we began polymer to polymer adhesion testing as described in the following examples.

EXAMPLE 1

E-beam evaporate 500 angstroms of Cr onto an Si wafer. Spin coat, pre-bake, and 400° C. cure RC5878 (PMDA-ODA manufactured by DuPont) polyimide (5.5-0.7 microns thick). Liquid polymer is spin coated onto the chrome layer. The chrome layer acts as an adhesion layer. E-beam evaporate a 2.5 micron thick Cu release dam to facilitate peel testing later. The wafers were split into control samples and samples for water vapor plasma treatment. Plasma conditions were 50 Watt, 175 millitorr and 25° C. electrode temperature. The samples are recombined and three layers of PMDA-ODA spin coated onto the previously deposited polyimide layer. The newly deposited liquid polyimide precursor is prebaked at 100° C. for five minutes between layers. At 100° C. for twenty hours after the last layer is deposited. Then the structure is cured at 400° C. for between 30 minutes to 1 hour. The thickness of the 5 mm peel lines was 16.2±2.1 microns thick. Five (5) millimeter wide lines are cut in the second polyimide layer. Ninety degree peel tests using stroke control at a rate of 4.55 mm/min. were performed. The control sample's peel strength was measured as 5±1 grams/mm and the water vapor plasma treated sample's peel strength was measured as 90±8 grams/mm. The water contact angles, measured as previously described, for 400° C. cured RC5878 are 65°±3° advancing and 45°±3° receding, for the control; and 12±2 degrees advancing and 3°±2° receding for the water vapor plasma treated sample.

EXAMPLE 2

Kapton R (trademark of Dupont) had been treated with a water vapor plasma. Two sheets of Kapton are treated with the water vapor plasma. The treated surfaces of the two sheets are laminated together at 1000 psi at 375° C. for 60 minutes. The measured adhesion strength was 30 gm/mm for the treated kapton sheets as compared to zero value for laminated untreated kapton sheets. The kapton sheets were approximately 2 mils. thick. The plasma treatment conditions are the same as in Example 1.

EXAMPLE 3

For the same conditions as described in Example 1 a liquid bis (hydroxy dimethyl silyl) benzene, as described in the U.S. Patent application of Babich the teaching of which has been incorporated herein by reference supra., was deposited onto a water vapor plasma treated polyimide layer and cured at 200° C.

EXAMPLE 4

The effects of a water vapor plasma treatment on BPDA-PDA surfaces which is a polymer of 3, 3''-biphenylenetetracarboxylic acid dianhydride and 1,4-phenylenedianine were studied. Films based on BPDA-PDA are available from UBE Corporation as Upilix and from Hitachi Chemical Company as PIQ-L100. First pass XPS spectroscopy showed post water vapor plasma increase in the surface oxygen due to increases carbonyl and ether moities. Peel test results demonstrated a dramatic increase in adhesion. This increase is still observed after 400 hours of 85°/81rh (relative humidity) testing.

EXAMPLE 5

To further define the useful range for water vapor plasma as a method of increasing polymer to polymer adhesion, an extended experimental matrix was run. The following experimental parameters were inspected: RF power from about 50 to about 200 watts, run pressure from about 50 to about 300 millitorr, run duration from about 5 to about 35 minutes and elapsed time before post plasma polymer coating from about 1 to about 48 hours. Samples used in this set of experiments consisted of: a silicon wafer having 250 angstroms of evaporated chrome and trialkylaminopropylsilane (as an adhesion promoter) and 2.8 microns of PMDA-ODA cured to 350° C. for one hour, a 2 micron copper release dam to facilitate peel strip initiation later. The polymer was plasma treated according to the specifications above and thereafter 18 microns of PI5878 polyimide was deposited from solution and cured to 350° C. for one hour.

Peel testing at 90° C. revealed that for all plasma conditions employed the polymer to polymer interfacial adhesion strength exceeded the tensile strength of the 18 micron thick polymer layer. Numerically this strength is greater than 125±28 gm/mm. Samples were subsequently subjected to 1000 hours of temperature and humidity testing at 85° C./81 relative humidity. After the 1000 hours of temperature and humidity, the peel strength dropped to 89.5±11 gm/mm. However, the polymer to polymer interfacial adhesion strength remained greater than the tensile strength of the polymer peeling layer even after the 1000 hours of stress. The peel strength after the 1000 hours stress of those samples which were not subjected to the water vapor plasma treatment were 11.6±3.0 gm/mm which is substantially less than the water vapor plasma treated samples.

It is to be understood that the above described embodiments are examples of the principles of the invention. Various other modifications and changes may be devised by those skilled in the art which will embody the principles of the invention and fall within the spirit and scope thereof.

We claim:

1. A method comprising:
providing a first and second polymer body;
treating at least a part of the surface of at least one of said first and said second polymer bodies with a water vapor containing plasma; and
contacting the treated surface of at least one of said first and said second polymer bodies with at least a part of the surface of the other of said first and said second polymer bodies.

2. The method of claim 1, wherein said treated surface of at least one of said first and said second polymer bodies is contacted with the treated surface of the other of said polymer bodies.

3. The method of claim 1, wherein said first and said second polymer bodies are contacted by being heated and pressed together.

4. The method of claim 3, wherein said first and said second polymer bodies are pressed together at a pressure greater than about 50 psi and at a temperature greater than about 200° C.

5. The method of claim 1, wherein each of said first and said second polymer bodies is a polyaromatic polymer.

6. The method of claim 5, wherein said polyaromatic polymer has a glass transition temperature greater than about 250° C.

7. The method of claim 1, wherein each of said first and said second polymer body is selected from the group consisting of:
polyamides
polyesters
polyurethanes
polysiloxanes
phenolics
polysulfides
polyacetals
polyethylenes
polyisobutylenes
polyacrylonitriles
polyvinylchlorides
polystyrenes
polymethylmethacrylates
polyvinylacetates
polytetrafluoroethylenes
polyisoprenes
polycarbonates
polyether polyimides
polybenzimidazoles
polybenzoxazoles
polybenzothiazoles
polyoxadiazoles
polytriazoles
polyquinoxalines
polyimmidazopyrrolones
and
copolymers containing an aromatic constituent and a constituent selected from a vinyl and cyclobutane group, said constituents containing at least one of the group of Si, Ge, Ti, Zn and Fe.

8. The method of claim 1, wherein said first and said second polymer bodies are polyimide bodies.

9. The method of claim 1, wherein said water vapor containing plasma is generated in an electric field from an electric power of from about $10^{-3}$ watts/cm$^3$ to about 1000 watts/cm$^3$ at a temperature of from about ambient to about the glass transition temperature of said treated polymer body and a pressure in the range from about $10^{-6}$ atmospheres to about 5 atmospheres for a period of time ranging from about 0.1 minutes to about 1 hour.

10. A method comprising:
providing a polymer body;
treating at least a part of the surface of said polymer body to a water vapor containing plasma;
disposing on said treated surface a liquid polymer; and
curing said liquid polymer.

11. The method of claim 10, wherein said polymer body is a polyaromatic polymer and wherein said liquid polymer is a precursor of a polyaromatic polymer.

12. The method of claim 10, wherein said polymer body and the polymer for which said liquid polymer is a precursor are selected from the group consisting of:
polyamides
polyesters
polyurethanes
polysiloxanes
phenolics
polysulfides
polyacetals
polyethylenes
polyisobutylenes
polyacrylonitriles
polyvinylchlorides
polystyrenes
polymethylmethacrylates
polyvinylacetates
polytetrafluoroethylenes
polyisoprenes
polycarbonates
polyether
polyimides
polybenzimidazoles
polybenzoxazoles
polybenzothiazoles
polyoxadiazoles
polytriazoles
polyquinoxalines
polyimmidazopyrrolones
and
copolymers containing an aromatic constituent and a constituent selected from a vinyl and cyclobutane group, said constituents containing at least one of the group of Si, Ge, Ti, Zn and Fe.

13. The method of claim 10, wherein said polymer body is a polyimide body and said liquid polymer is a precursor of a polyimide polymer.

14. The method of claim 10, wherein said water vapor containing plasma is generated in an electric field from an electric power of from about $10^{-3}$ watts/cm$^3$ to about 1000 watts/cm$^3$ at a temperature of from about ambient to about the glass transition temperature of said treated polymer body and a pressure in the range from about $10^{-6}$ atmospheres to about 5 atmospheres for a period of time ranging from about 0.1 minutes to about 1 hour.

15. The method of claim 13, wherein said liquid polyimide precursor is cured at a temperature from about 100° C. to about 400° C. for about 1 minute to about 10 hours.

16. A method for enhancing the adhesion of a first and second polymer surface comprising treating at least one of said first on said second polymer surfaces with a water vapor containing plasma and thereafter bringing said surfaces into contact.

* * * * *